United States Patent [19]

Shionoya

[11] Patent Number: 4,716,406

[45] Date of Patent: Dec. 29, 1987

[54] SEQUENTIAL SELECTION CIRCUIT

[75] Inventor: Toshio Shionoya, Kanagawa, Japan

[73] Assignee: Sony Corporation, Tokyo, Japan

[21] Appl. No.: 725,816

[22] Filed: Apr. 22, 1985

[30] Foreign Application Priority Data

Apr. 25, 1984 [JP] Japan .................... 59-83330

[51] Int. Cl.$^4$ .............................. G09B 3/28
[52] U.S. Cl. ...................... 340/814; 340/801; 340/758; 358/160
[58] Field of Search ............... 340/802, 811, 715, 784, 340/721, 781, 801, 758, 768, 771, 776, 789; 315/169.1, 169.4; 358/216, 148, 150, 160, 149

[56] References Cited

U.S. PATENT DOCUMENTS

| | | | |
|---|---|---|---|
| 3,849,702 | 11/1974 | Eisenberg et al. | 340/771 |
| 4,499,459 | 2/1985 | Sasaki et al. | 340/811 |
| 4,556,880 | 12/1985 | Hamada | 340/814 |
| 4,574,280 | 3/1986 | Weber | 340/771 |

FOREIGN PATENT DOCUMENTS 0051727  4/1979  Japan ....................... 340/781

Primary Examiner—Marshall M. Curtis
Attorney, Agent, or Firm—Hill, Van Santen, Steadman & Simpson

[57] ABSTRACT

A protective circuit for a sequentially selecting circuit which selects a series of circuit element electrodes one by one with signals which are generated by a shift register. The invention includes a counter for generating a count output corresponding to the total number of selections made. An input pulse of the shift register is formed according to the output from the counter and the timing pulse and the counter is reset according to the timing pulse and a clock pulse of the selection. With such arrangement when the timing pulse is not generated, the counter will not operate and an effective input pulse to the shift register will not be generated and therefore the shift register will not sequentially read erroneous inputs and a plurality of shift stage outputs will not be generated at the same time. In this manner, the selected circuits, elements, electrodes and drive circuit of power supply will be prevented from being damaged.

5 Claims, 16 Drawing Figures

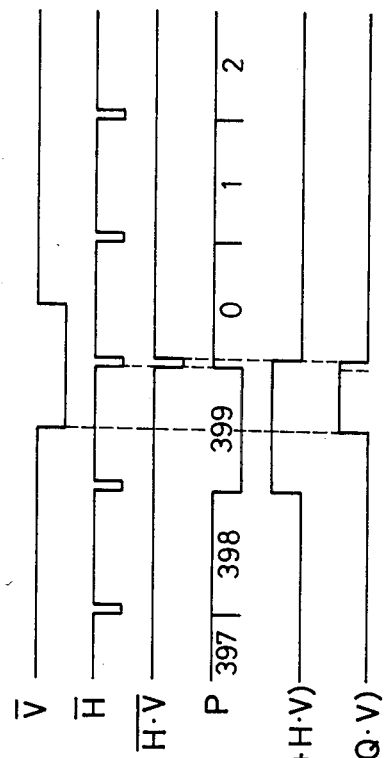
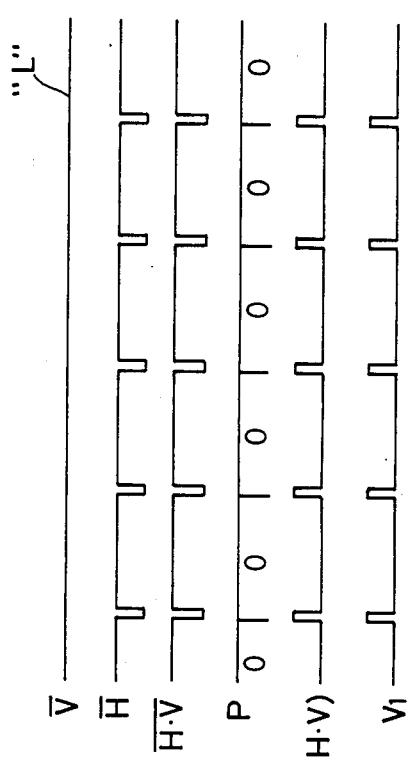

SEQUENTIAL SELECTION CIRCUIT

BACKGROUND OF THE INVENTION

Field of the Invention

The present invention relates in general to a sequential selection circuit and more particularly to a protective circuit suitable for scanning the cathodes and comprising a selection circuit of a matrix type plasma display.

Description of the Prior Art

Plasma display panels of an X-Y matrix type are known as a means for displaying characters or images. An X-electrode group (data electrodes) comprises anodes to which high and low voltages are applied according to the display data. A Y-electrode group (scanning electrodes) comprise cathodes which are scanned in a line sequential manner with a negative voltage pulse being applied.

A cathode scanning circuit comprises a shift register having the same number of shift stages as the number of cathodes and a group of drive transistors which are sequentially turned on in response to outputs from respective stages of the shift register so as to apply voltages to the cathodes. If it be assumed that a pulse of a scanning period of the cathode is an H pulse which is the horizontal scanning pulse and a pulse of one frame period (one frame) is a V pulse which is the vertical scanning pulse, the shift register receives a V pulse of high level and sequentially transfers it to succeeding stages using the H pulses as clock signals. Since the V pulse returns to a low level immediately after being received by the shift register, single data is always shifted in the shift register through the stages one by one so that the cathodes are sequentially activated.

However, if the V pulse of high level becomes an abnormally long pulse width or when the V pulse is fixed at a high level due to short circuiting of a circuit or element, a plurality of stages in the shift register will simultaneously be set to "1" and a plurality of cathodes will be selected at the same time. In this case, current through the discharge cells will be considerably increased and power supply units or drive transistors of the cathode drive circuit can be damaged.

SUMMARY OF THE INVENTION

It is an object of the present invention to solve the above problem and has its object to satisfactorily perform sequential selection without damage to the circuit elements.

A sequential selection circuit according to the present invention selects series of circuits, elements, electrodes and the like over a long period to actuate them sequentially one by one for a short period and comprises a shift register which has a number of shift stages corresponding to the total number of elements selected for shifting a single input pulse by clock pulses corresponding to the short period which is an H pulse in the present embodiment so as to generate a selection signal. A counter is provided for generating a pulse output when the count of the clock pulse reaches the total selection number. An input pulse of the shift register is selected according to the pulse output of the counter and a pulse corresponding to the long period which is a timing pulse which initiates sequential selection and corresponds to a vertical pulse in the present embodiment is utilized. Also, the counter is reset in response to the clock pulse and the pulse corresponding to the long period.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIGS. 5A through 5F are waveforms for illustrating operation of the invention; and FIGS. 6A through 6F are waveforms illustrating the timing chart for explaining the invention.

DESCRIPTION OF THE PREFERRED EMBODIMENTS

Figure 1:
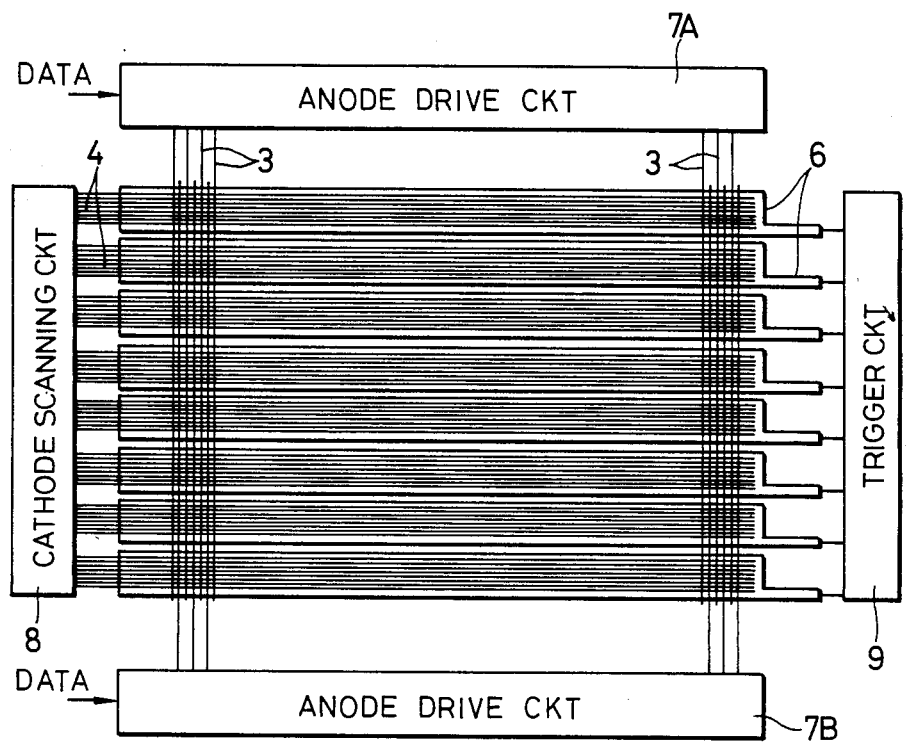
FIG. 1 is a schematic plan view of a plasma display panel to which a sequential selection circuit of the present invention can be applied.
Figure 2:
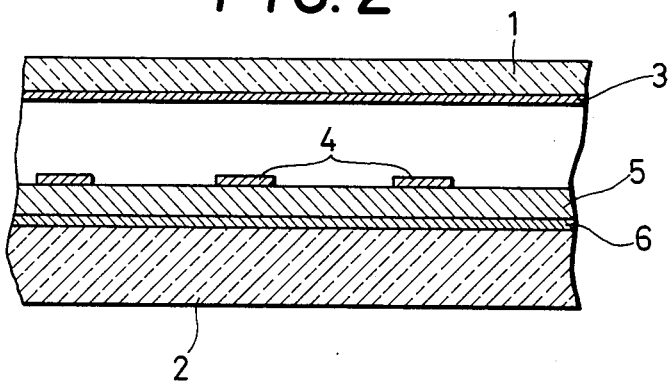
FIG. 2 is a sectional view of a portion of the panel of FIG. 1.

FIG. 1 is a schematic plan view of a plasma display panel PDP which has a sequential selection circuit that may be of the form of the present invention. FIG. 2 is a partial sectional view of the panel illustrated in FIG. 1. The plasma display panel comprises a front glass panel 1 and a rear glass panel 2 with anodes 3 which are data electrodes and cathodes 4 which are scanning electrodes that are sandwiched between the glasses 1 and 2 which are sealed together and the anodes 3 and cathodes 4 are arranged in a X-Y matrix with small discharge gaps formed therebetween. Trigger electrodes 6 are divided into a plurality of phases such as eight phases and are arranged under and along and parallel to the cathodes 4.

Alternate anodes 3 are coupled together and a first group of the alternate electrodes 3 are coupled to an upper anode driver 7A and with the other alternate group of anodes connected to a lower anode driver 7B. A data voltage of high level such as "1" or low level such as "0" corresponding to the display data is applied to the anodes in synchronism with the cathode scanning voltage through a shift register which produces a parallel output and a switching output element of the drivers 7A and 7B according to the data display input which is in serial form.

A negative voltage is applied to the cathodes 4 by a cathode scanning circuit 8 from an upper edge to a lower edge in a line sequential manner. A discharge is generated between the selected cathode 4 and the anode 3 to which a high voltage is applied.

The trigger electrodes 6 are driven by a trigger circuit 9 in a phase sequential manner and high trigger voltage pulses are supplied to the trigger electrode 6 in an active phase in synchronism with a cathode scanning timing. Trigger discharges are generated between the trigger electrode 6 and the associated cathodes 4 and a breakdown voltage between the anode and the cathode is decreased by spatial ions due to this discharge thereby inducing a main discharge between the anode and the cathode.

Figure 3:
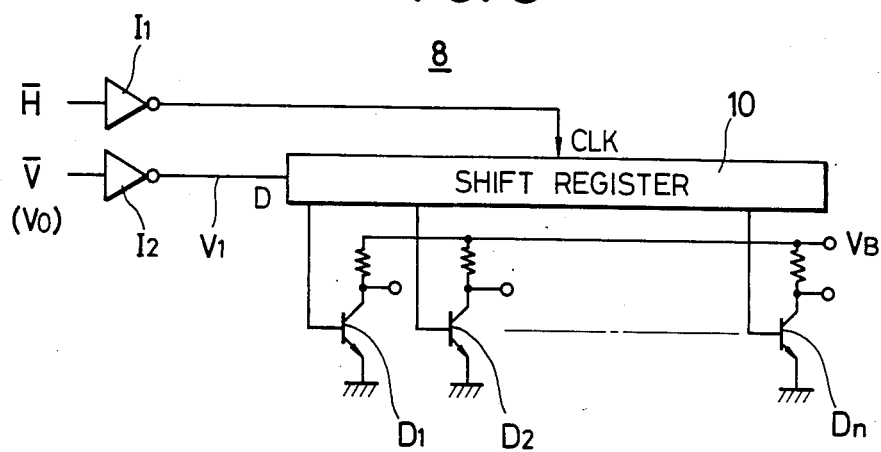
FIG. 3 is a circuit diagram of a cathode scanning circuit.

FIG. 3 illustrates a cathode scanning circuit 8 which comprises a shift register 10 which has the same number of shift stages as there are cathodes 4. Cathode drive transistors D1, D2 ... Dn are connected at the output of the shift registers and they are respectively turned on by outputs from respective shift stages. The cathodes 4 are connected to corresponding collectors of the transistors D1 through Dn. Each time a selected transistor is turned on, ground potential is applied to a selected one of the cathodes. The cathodes which are not selected are maintained at a positive bias voltage $V_B$. Thus, even when a data voltage is applied to the anodes which is opposite the nonselected cathode line the cell will not generate a discharge.

Horizontal pulses H of a cathode scanning period corresponding to a horizontal scanning period are illustrated in FIG. 5A are supplied as a clock input CLK to the shift register 10 through an inverter $I_1$. A vertical pulse V of a frame period corresponding to the vertical scanning period is illustrated in FIG. 5A is supplied to a data input D through an inverter $I_2$. The V pulse is received by the shift register at the beginning of a frame and is sequentially shifted at a clock period thereby sequentially supplying an output "1" to the transistors $D_1$ to $D_n$.

In the event a malfunction occurs, such that the V pulse decreases to a low level, the data input D of the shift register 10 will be maintained at a high level and all the outputs from the shift register will be set to "1" and this can damage a cathode driver or the power supply due to overload.

Figure 4:
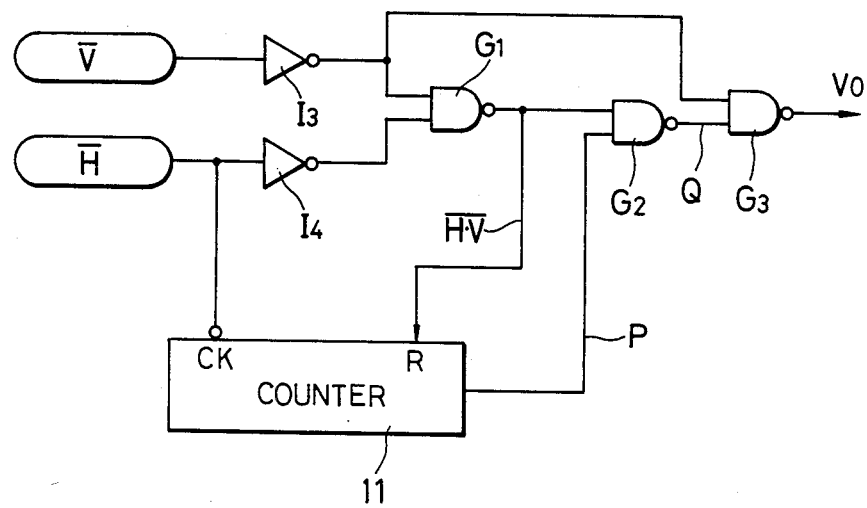
FIG. 4 is a circuit diagram of an input protection circuit for a shift register shown in FIG. 3 according to the invention.

The invention solves this problem with the circuit illustrated in FIG. 4 which is connected to the circuit of FIG. 3. To solve this problem, the V pulse is supplied to the shift register through the protective circuit of FIG. 4. The protective circuit comprises a counter 11 which has the same count number as they are cathodes which in a particular example may be 400 count. The H pulse illustrated in FIG. 5B is supplied to a clock input CK illustrated in FIG. 4B. A negative logic AND signal H.V is illustrated in FIG. 5C which is a combination of the H and V pulses illustrated in FIGS. 5A and 5B is supplied to the reset input R of the counter 11 through inverters I3 and I4 and a NAND gate G1.

The counter 11 generates a low level output which is illustrated in FIG. 5D as pulse form P at count "399" and is reset by the reset pulse $\overline{H.V}$ illustrated in FIG. 5C so as to generate a high level output of a count "0". The count output P is supplied to a NAND gate G2 together with the output $\overline{H.V}$ of the NAND gate G1 and generates a pulse which is the NANDED output of an inverted output $\overline{P}$ of the pulse P and inverted pulse $\overline{H.V}$ of the pulse $\overline{H.V}$ which is illustrated in FIG. 5E. The pulse Q is supplied to a NAND gate G3 together with the output V of the inverter I3 so as to form a pulse output signal $V_0 = \overline{(Q.V)}$. The output pulse $V_0$ is illustrated in FIG. 5F and this output pulse $V_0$ is supplied to the data input D of the shift register 10 illustrated in FIG. 3 through the inverter $I_2$ as a pulse V1 (Q.V) which is illustrated in FIG. 5F. This pulse is applied to the input D in FIG. 3 rather than the V pulse which is applied without the invention.

As a result of the invention, the inputs are supplied to the shift register for each V period which is the frame period and are sequentially shifted.

FIGS. 6A through 6F illustrate that when a malfunction occurs such that the V pulse ($\overline{V}$) illustrated in FIG. 6A is fixed and maintains a low level "L" then the reset pulse is supplied to the reset input of the counter 11 at each reception of the H pulse illustrated as shown in FIG. 6C (ovs/$\overline{H}$/ .$\overline{V}$). Thus, the counter 11 will always be reset and the count will not be incremented, in other words, it will be kept at "0". For this reason, the count output will be at a high level as illustrated in FIG. 6D by curve P. The output Q from the NAND gate G2 then becomes the pulse H.V which is the inverted pulse of the reset pulse $\overline{H.V}$. The input pulse V1 which is generated through the NAND gate G3 and the inverter $I_2$ which is applied to the shift register 10 will be the same as the pulse Q illustrated in FIG. 6F and designated as V1.

The input pulse V1 is formed in the protection circuit and the H pulse ($\overline{H}$) passes through the inverter I4, the NAND gates G1, G2 and G3 illustrated in FIG. 4 and the inverter $I_2$ illustrated in FIG. 3. For this reason, the leading edge of the input pulse V1 will be delayed slightly from that of the H pulse. Therefore the shift register 10 does not receive the input pulse V1 as data and all of the outputs are kept at a low level. Thus, a plurality of the cathodes 4 will not be turned on at the same time.

In the embodiment described above, the logic circuits comprising I3, I4, G1, G2 and G3 which constitute the protection circuit of FIG. 4 can be replaced with a read only memory ROM which can accomplish the same results.

Thus, the present invention incorporates a protection circuit for a plasma display panel or other device which prevents the shift register from sequentially reading erroneous inputs and producing a plurality of shift stage outputs at the same time. This prevents selected circuits, elements, electrodes and drive circuits and power supplies from being damaged.

Although the invention has been described with respect to preferred embodiments, it is not to be so limited as changes and modifications can be made which are within the full intended scope of the invention as defined by the appended claims.

I claim as my invention:

1. A sequential selection circuit which selects series of circuits, elements and, electrodes over a long period to activate them sequentially one by one for a short period, comprising a shift register which has a number of shift stages corresponding to the total number that is to be selected, for sequentially shifting a single input pulse in response to clock pulses corresponding to the short period; a counter for counting the clock pulses so as to generate an output voltage level which is low when the count reaches the total number to be selected; an input circuit for generating an input pulse for said shift register depending on the voltage level from the counter and a pulse corresponding to the long period; and a reset circuit for resetting said counter in accordance with the clock pulse and the pulse corresponding to the long period.

2. A sequential selection circuit for a plasma display device which selects and energizes a plurality of electrodes to sequentially generate a number of displays for a short period to produce display comprising a shift register which has a number of shift stages corresponding to the number of displays for a short period so as to sequentially shift a single display pulse in response to clock pulses corresonding to said short period, a counter receiving and counting said clock pulses and generating an output pulse when the count reaches the number of lines, an input circuit for said shift register receiving the output of said counter and a pulse which corresponds to said long period, a reset circuit for said counter which receives said clock pulse and said pulse which corresponds to said long period.

3. A sequential selection circuit according to claim 2 wherein said input circuit for said shift register comprises a first NAND gate which receives said clock pulse and said pulse which corresponds to said long period, a second NAND gate which receives the output of said counter and the output of said first NAND gate, and a third NAND gate which receives said pulse period and the output of said second NAND gate.

4. A sequential selection circuit according to claim 3 wherein said reset circuit includes said first NAND gate which produces a reset pulse for said counter.

5. A sequential selection circuit according to claim 2 wherein said clock pulse corresponds to the horizontal scan frequency of said display device and long period comprises to the vertical scan period of said display device.

* * * * *